United States Patent
Jacob et al.

(10) Patent No.: US 9,001,855 B1
(45) Date of Patent: Apr. 7, 2015

(54) METHODS AND SYSTEMS FOR REDUCING SLOW AXIS DIVERGENCE IN LASER DIODES

(71) Applicants: Jonah H. Jacob, Brookline, MA (US); Henry M. Eppich, Andover, MA (US); Geoffrey O. Campbell, Sommerville, MA (US); Wenyang Sun, Belmont, MA (US)

(72) Inventors: Jonah H. Jacob, Brookline, MA (US); Henry M. Eppich, Andover, MA (US); Geoffrey O. Campbell, Sommerville, MA (US); Wenyang Sun, Belmont, MA (US)

(73) Assignee: Science Research Laboratory, Inc., Somerville, MA (US)

( * ) Notice: Subject to any disclaimer, the term of this patent is extended or adjusted under 35 U.S.C. 154(b) by 11 days.

(21) Appl. No.: 13/912,839

(22) Filed: Jun. 7, 2013

Related U.S. Application Data (60) Provisional application No. 61/656,730, filed on Jun. 7, 2012.

(51) Int. Cl.
*H01S 3/04* (2006.01)
*H01S 5/024* (2006.01)

(52) U.S. Cl.
CPC .................... *H01S 5/02476* (2013.01)

(58) Field of Classification Search
CPC .. H01S 5/024; H01S 5/02469; H01S 5/02476
USPC .................................. 372/34, 35, 36
See application file for complete search history.

(56) References Cited

U.S. PATENT DOCUMENTS

| 8,233,513 | B1 | 7/2012 | Schleuning et al. | |
| 8,446,926 | B2 * | 5/2013 | Schleuning et al. | ............ 372/36 |

* cited by examiner

*Primary Examiner* — Armando Rodriguez
(74) *Attorney, Agent, or Firm* — Burns & Levinson LLP; Orlando Lopez (57) ABSTRACT

A method, and systems to implement the method, for reducing slow axis divergence in a laser diode bar including tailoring a power deposition profile across the emitter so as to reduce thermal gradients, thereby resulting in a substantially (nearly) uniform temperature across the width of the emitter.

21 Claims, 13 Drawing Sheets

FEM HEAT TRANSFER ANALYSES VERIFY PEDESTALS PRODUCE
1-D HEAT FLOW & UNIFORM TEMPERATURE

METHODS AND SYSTEMS FOR REDUCING SLOW AXIS DIVERGENCE IN LASER DIODES

CROSS REFERENCE TO RELATED APPLICATIONS

This application claims priority to U.S. Provisional Application Ser. No. 61/656,730, filed on Jun. 7, 2012, entitled, "METHODS FOR REDUCING SLOW AXIS DIVERGENCE IN LASER DIODES," which is incorporated by reference herein in its entirety for all purposes.

STATEMENT REGARDING FEDERALLY SPONSORED RESEARCH OR DEVELOPMENT

This invention was made partially with U.S. Government support from the U.S. Defense Advanced Research Projects Agency (DARPA) under contract W911NF-10-C-0107. The U.S. Government has certain rights in the invention.

BACKGROUND

Lateral heat spreading for uniform volumetric waste heat production in a single emitter stripe produces a lateral temperature gradient across the emitter. This temperature gradient gives rise to index of refraction changes producing an intra-cavity thermally induced lens that varies with LD power. This, in turn, results in a slow axis divergence that increases significantly with LD power, thereby reducing device brightness significantly with increasing LD power. Slow axis divergence (SAD) measurements show that thermal lensing results in a ~2× increase in SAD and a corresponding decrease in brightness. Measurements show that SAD increase with LD power is a thermal effect (See FIG. 1).

There is a need for methods for reducing slow axis divergence.

BRIEF SUMMARY

In one or more embodiments, the method of these teachings for reducing slow axis divergence in a laser diode bar includes placing one or more pedestal structures ("pedestals") on the thermal management component, placing the laser diode bar such that emitters are disposed over the pedestals, thereby obtaining substantially uniform junction temperatures across the width of each emitter, resulting in a substantially one-dimensional heat transfer.

In one instance, pedestals are provided on the surface of the thermal management component on which the laser diode bar is disposed. The pedestals are substantially located below the emitters.

In another embodiment, the method of these teachings includes tailoring a power deposition profile across the emitter so as to reduce thermal gradients, thereby resulting in a substantially (nearly) uniform temperature across the width of the emitter.

Embodiments of systems that implement the method are also disclosed.

For a better understanding of the present teachings, together with other and further needs thereof reference is made to the accompanying drawings and detailed description and its scope will be pointed out in the appended claims.

DETAILED DESCRIPTION

The following detailed description presents the currently contemplated modes of carrying out the invention. The description is not to be taken in a limiting sense, but is made merely for the purpose of illustrating the general principles of the invention.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about."

Figure 1:
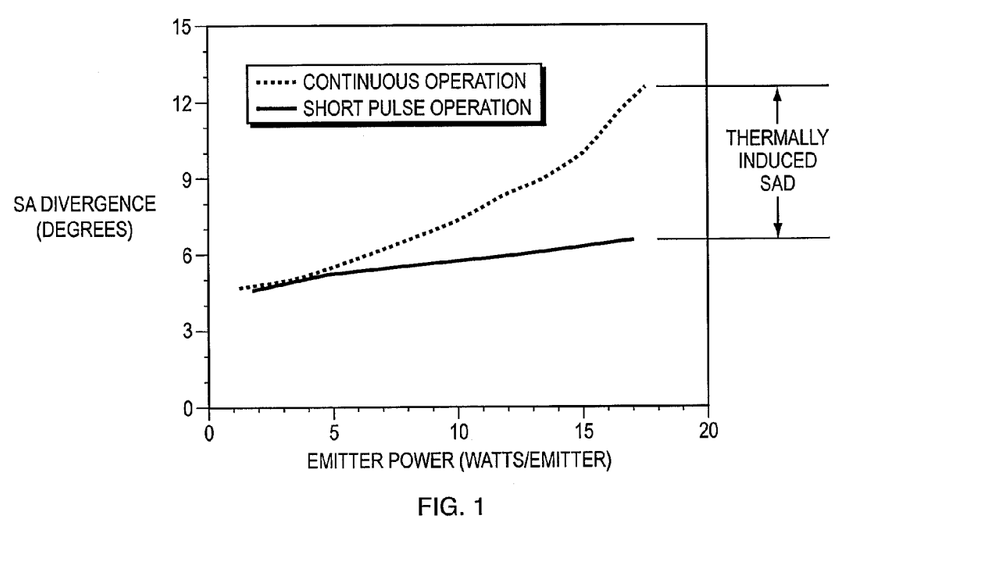
FIG. 1 shows slow axis divergence variation with power for a laser diode bar under continuous mode and short pulse operation.

Slow axis divergence (SAD) increases with power under continuous mode operation. The difference between short pulse and continuous operation, as shown in FIG. 1, indicates that SAD increases are due to thermal effects. FEA (finite element analysis) calculations have been used to verify continuous mode operation generates the spatial temperature gradients responsible for SAD increases.

In one embodiment, the method of these teachings for reducing slow axis divergence in a laser diode bar includes tailoring a power deposition profile across the emitter so as to reduce thermal gradients, thereby resulting in a substantially (nearly) uniform temperature across the width of the emitter.

Figure 1A:
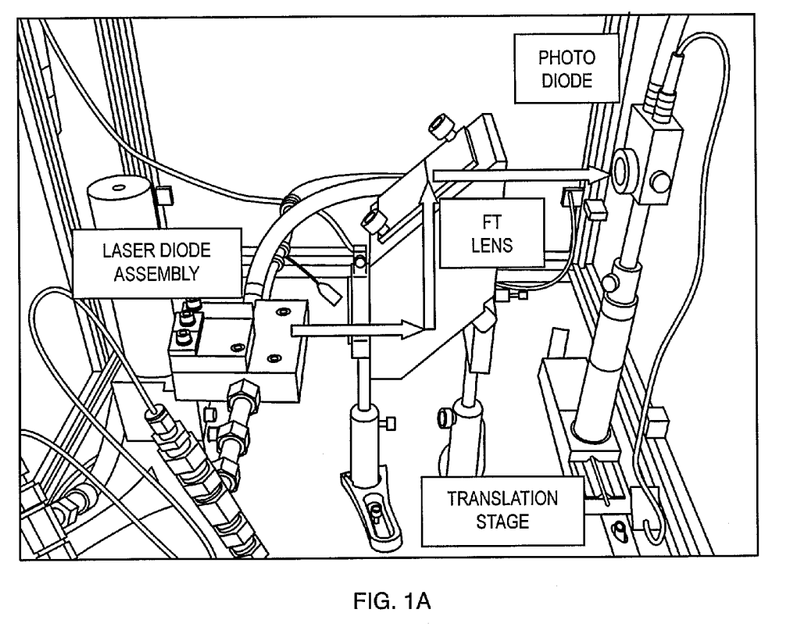
FIG. 1a is a pictorial representation of a LD bar slow axis divergence measurement station.

In one exemplary instance, these teachings not being limited to the exemplary instance, the slow axis (SA) divergence of photons from long gain-length laser diodes (LDs) has been measured. The data, in that exemplary instance, exhibits a strong increase in the SA divergence with drive current. The measurement setup, for that exemplary instance, is shown in FIG. 1a. A Fourier transform lens was used to bring the far-field to the back focal plane of the lens. A high speed photodiode was used to measure the optical intensity at the back focal plane. A computer controlled motorized stage was used to scan the photodiode across the full range of the far-field from −15° to +15°. In order to determine whether changes in the SA divergence are due to thermal effects, the LD bars were operated in two different modes: (a) continuous mode (CW) and (b) short pulse mode. For the short pulse mode, the data was acquired within a 50 ns narrow window 1 µs after the rising edge of the drive current pulse, thereby insuring the optical modes reached steady state. In addition, the increase in the junction temperature after ~1 µs is substantially minimal (<2K) and the effects of thermal lensing are substantially insignificant.

In the exemplary instance, the SA divergence was also measured for various values of injected current and optical power. The results are shown in FIG. 1. It can be seen that when the output power per emitter is larger than 4 W, the SA divergence increases faster with increasing power under CW operation than under short pulse operation. For an exemplary output power of 17 W (LD driven at ~10.5 A/emitter), the difference in SA divergence between the CW and short pulse modes is >6° (a ~2× increase over the short pulse divergence).

While not desiring to be strictly bound by theory, the SA divergence of the short pulse mode can be attributed to be the intrinsic divergence that is the result of the lateral modes of the laser resonating inside the cavity. The additional divergence under CW operation can be attributable to lensing resulting from thermal gradients.

Tailoring the power deposition profile across the emitter can reduce the thermal gradient resulting in a nearly uniform temperature across the width of the emitter relative to the temperature profile produced by uniform power deposition.

Figure 2:
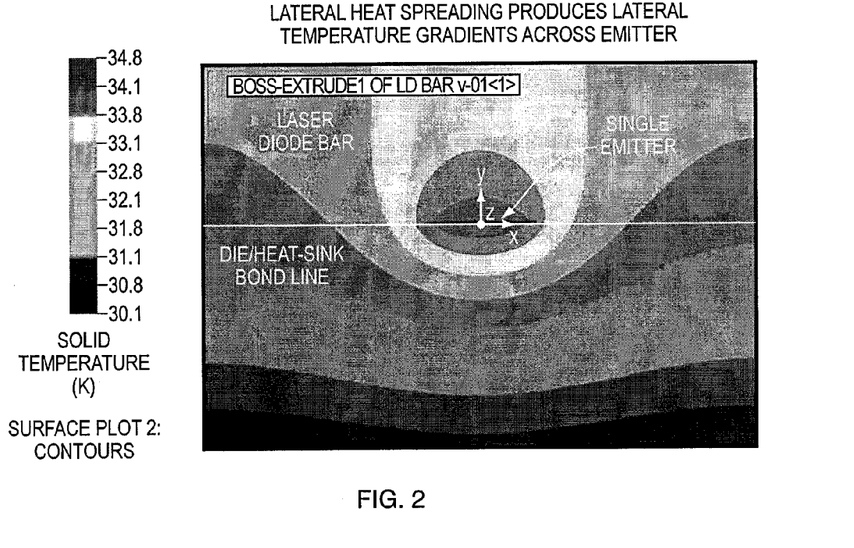
FIG. 2 depicts results of FEA calculations illustrating lateral temperature gradients across an emitter in a laser diode bar.
Figure 3:
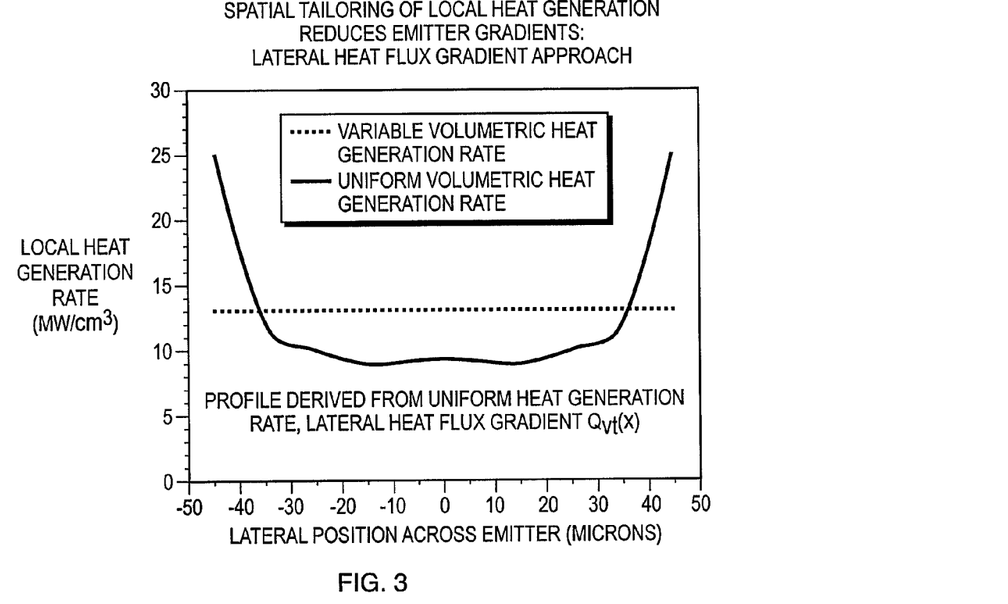
FIG. 3 is a graphical representation of local heat generation rate versus lateral position across emitter for two different volumetric heat generation rates.

FIG. 2 shows FEA calculations illustrating that lateral heat spreading produces lateral temperature gradients across an emitter. FIG. 3 illustrates that spatial tailoring of local heat generation can reduce emitter gradients.

In one instance, a power to position profile can be obtained from the gradient of the lateral heat flux profile produced in a uniform power distribution case by Starting with $Q_{vc}(x) = d(q_{xc})/dx$, where $Q_{vc}(x)$ is an effective waste heat volumetric generation profile obtained from the constant waste heat volumetric generation case, $q_{xc}$ is the lateral heat flux from the constant waste heat volumetric generation case and x is the lateral coordinate across the width of an emitter;

$Q_{vt}(x)$, the desired tailored waste heat volumetric generation profile, is obtained by:

$$Q_{vt}(x) = Q_c - \frac{1}{w}\int_0^w Q_{vc}(x)\,dx + Q_{vc}(x)$$

where $Q_c$ is the uniform case constant waste heat volumetric generation rate and w is emitter width;

$Q_{vt}(x)$ is shown below to yield a nearly constant temperature at the emitter except at the very edges of the emitter.

Figure 3A:
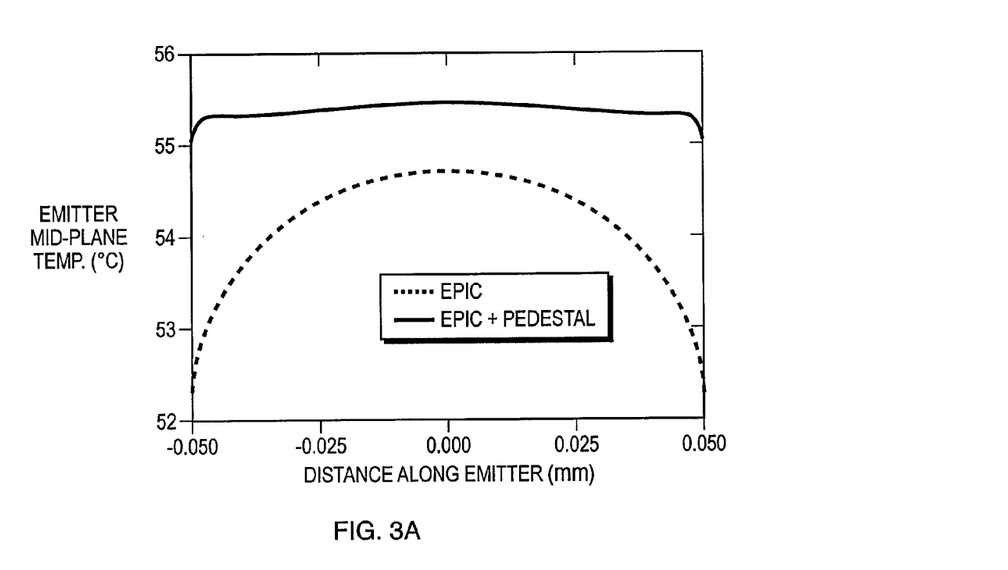
FIG. 3a is a graphical representation of Temperature gradients across the width of LD emitters for a conventional cooler design and a cooler design of these teachings.
Figure 3B:
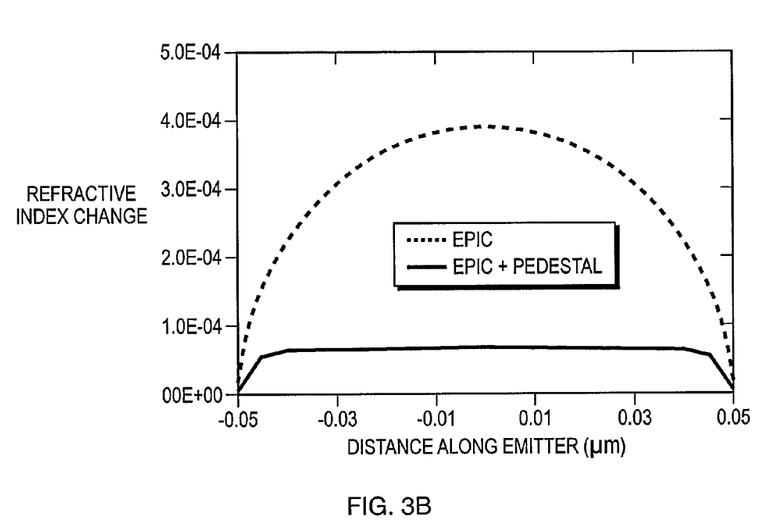
FIG. 3b is a graphical representation of Refractive index gradient across the width of the emitter with for a conventional cooler design and a cooler design of these teachings.
Figure 3C:
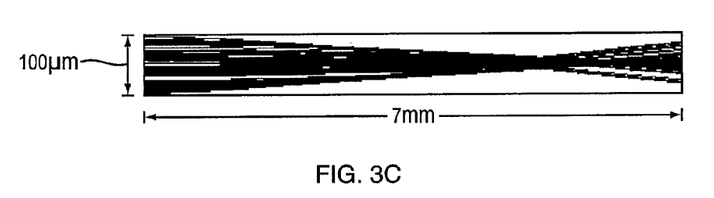
FIG. 3c is a graphical representation of Zemax® predictions of the simplified laser cavity with GRIN lens profile corresponding to FIG. 3b.

As stated above, in one explanation, the intra-cavity lens induced by the temperature gradient across the width of the laser cavity results in the increase in the SA divergence. FIG. 3a presents, for another exemplary embodiment, the temperature profiles across a single emitter based on a finite element thermal simulation using in a 20% fill factor, 7 mm cavity length, 10 mm wide laser diode bar containing 100 µm wide emitters and operating at a total drive current of 350 A (~330 W optical, 50% power conversion efficiency). Cooling was modeled based on a predetermined ("EPIC") heat sink, which has a 30 mK-cm²/W thermal resistance. The temperature difference from the center to the edge of an emitter is approximately 2.2° C., which results in a refractive index change of $\Delta n = 4\cdot 10^{-10}$ from the center to the edge (see the green curve in FIG. 3b). This refractive index gradient forms a distributed GRIN lens, as shown in FIG. 3c. To estimate how the thermally induced GRIN lens affects the SA divergence, a simplified laser cavity was modeled using Zemax® (a ray-trace optics simulation software package). The refractive index modulation shown in FIG. 3b (green curve) was assigned across the full width (100 µm) of a 7 mm long laser cavity. Parallel rays were launched at the back of the laser cavity with zero divergence. At the output end of the laser cavity, the SA divergence was predicted to be 4.2°. This divergence is slightly smaller than the 6° measured experimentally. This difference is probably due to the simplicity of the optical model, which omits multiple round trips of the photons resonating in the laser cavity.

Figure 3D:
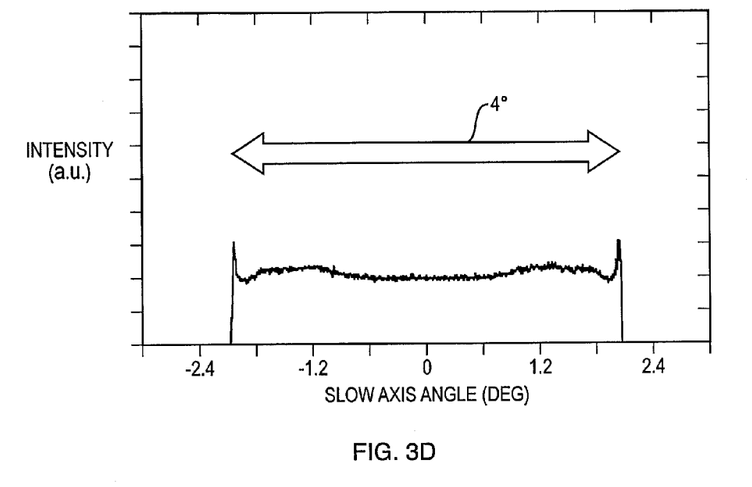
FIG. 3d is a graphical representation of the SA divergence predicted at the output of the simplified laser cavity with the conventional coolers.
Figure 3E:
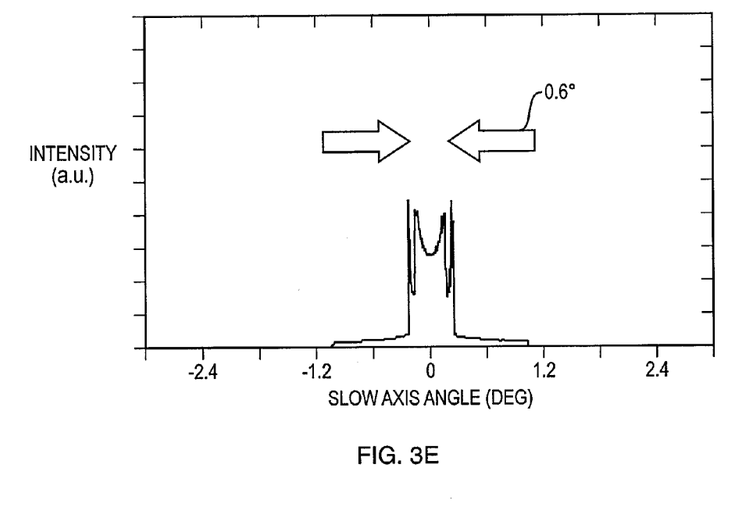
FIG. 3e is a graphical representation of the SA divergence is reduced from 4.2° to 0.6° by use of the cooler design of these teachings.

Although the Zemax model is simplified, the model shows the large increase in SA divergence above the intrinsic component induced by the temperature gradient across the width of the emitters. A cooler design of these teachings eliminates the temperature gradient (see FIG. 3a, EPIC+pedestal) thereby greatly reducing the thermally induced SA divergence. FIG. 3b shows that the cooler design of these teachings greatly reduces refractive index changes across the full width of the emitter. When predictions are based on the flattened refractive index profile, FIGS. 3d and 3e show that the slow axis divergence is reduced from 4.2° to 0.6°, a strong indicator that the effect is thermally based and can be minimized by reducing the temperature gradient across the emitters.

The deleterious effects of thermal lensing can be eliminated by requiring the temperature across emitters to be constant. This requires the lateral temperature gradient and hence the lateral heat flux to be zero, which constrains the heat flow to be one dimensional (1D) and normal to the plane of the emitter.

Figure 4:
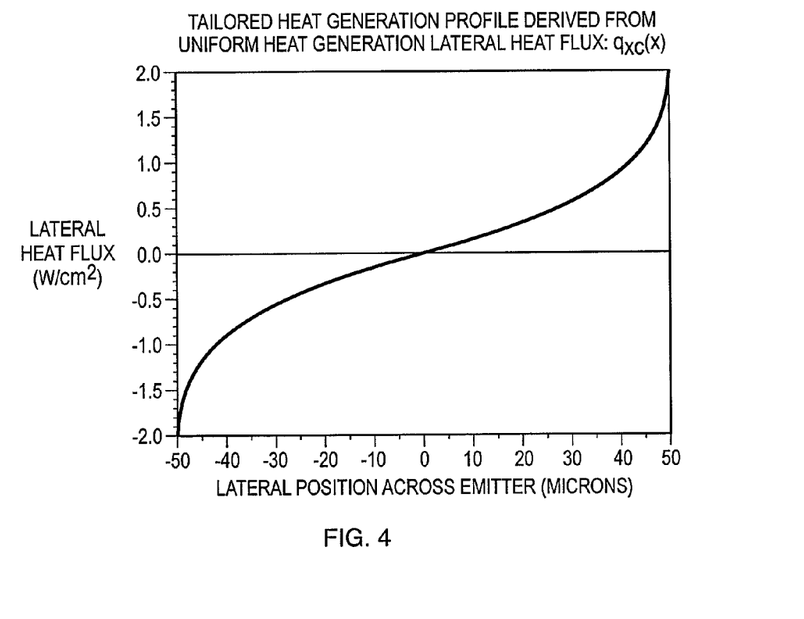
FIG. 4 is a graphical representation of lateral heat flux versus lateral position across emitter for two different volumetric heat generation rates.
Figure 5:
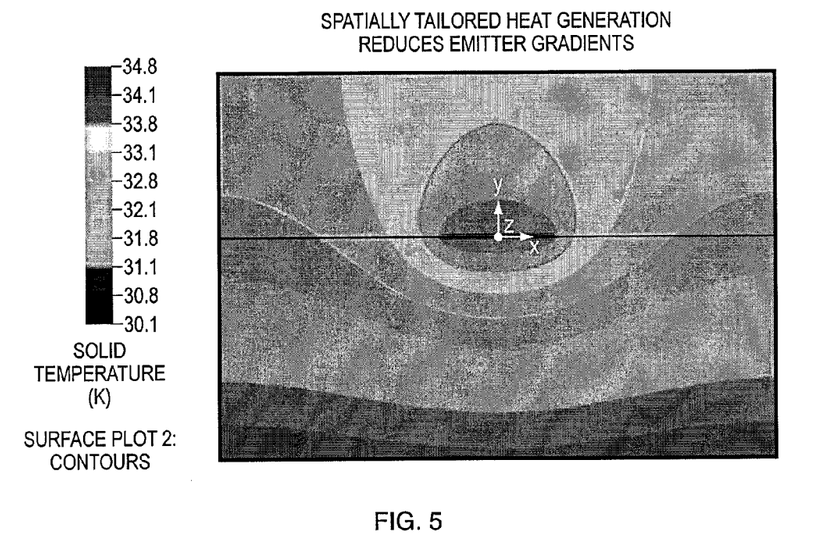
FIG. 5 shows the results of FEA calculations illustrating the effects of specially tailored heat generation.
Figure 6:
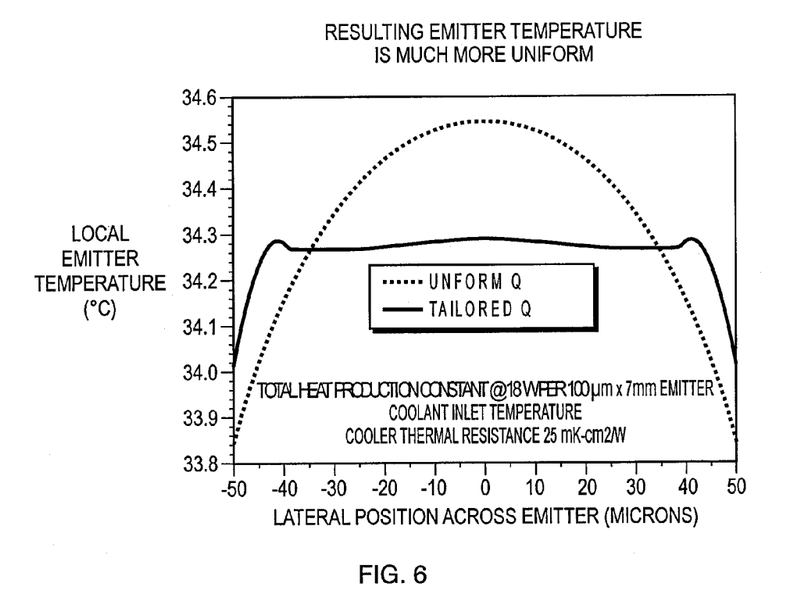
FIG. 6 is a graphical representation of local emitter temperature versus lateral position across emitter for two different volumetric heat generation rates.

FIG. 4 shows the tailored generation profile the drive from uniform heat generation lateral heat flux. FIGS. 5 and 6 show the results of FEA calculations illustrating that specially tailored heat generation can reduce emitter gradients.

One embodiment of the method and system for obtaining nearly constant temperature at the emitter is detailed below.

In one or more embodiments, the method of these teachings for reducing slow axis divergence in a laser diode bar includes placing one or more pedestal structures ("pedestals") on the thermal management component, placing the laser diode bar such that emitters are disposed over the pedestals, thereby obtaining substantially uniform junction temperatures across the width of each emitter, resulting in a substantially (nearly) one-dimensional heat transfer.

In one embodiment, the system of these teachings includes a thermal management component (also referred to as a "cooler" or a "heat sink") and one or more pedestal structures (also referred to as "pedestals"), each pedestal structure having a base and two support members, each support member being disposed along a length of the base and extending away from the base, one support member being disposed at one end of the width of the base and the other support member being disposed at the other end of the width of the base, the two support members being disposed on and in thermal and electrical connection to the thermal management component, the width of the base of one pedestal structure being substantially equal to a width of one emitter in the laser diode component (also referred to as a "laser diode bar"). A height of each support member in one pedestal structure is a distance from the thermal management component to the base in that pedestal structure.

Figure 7:
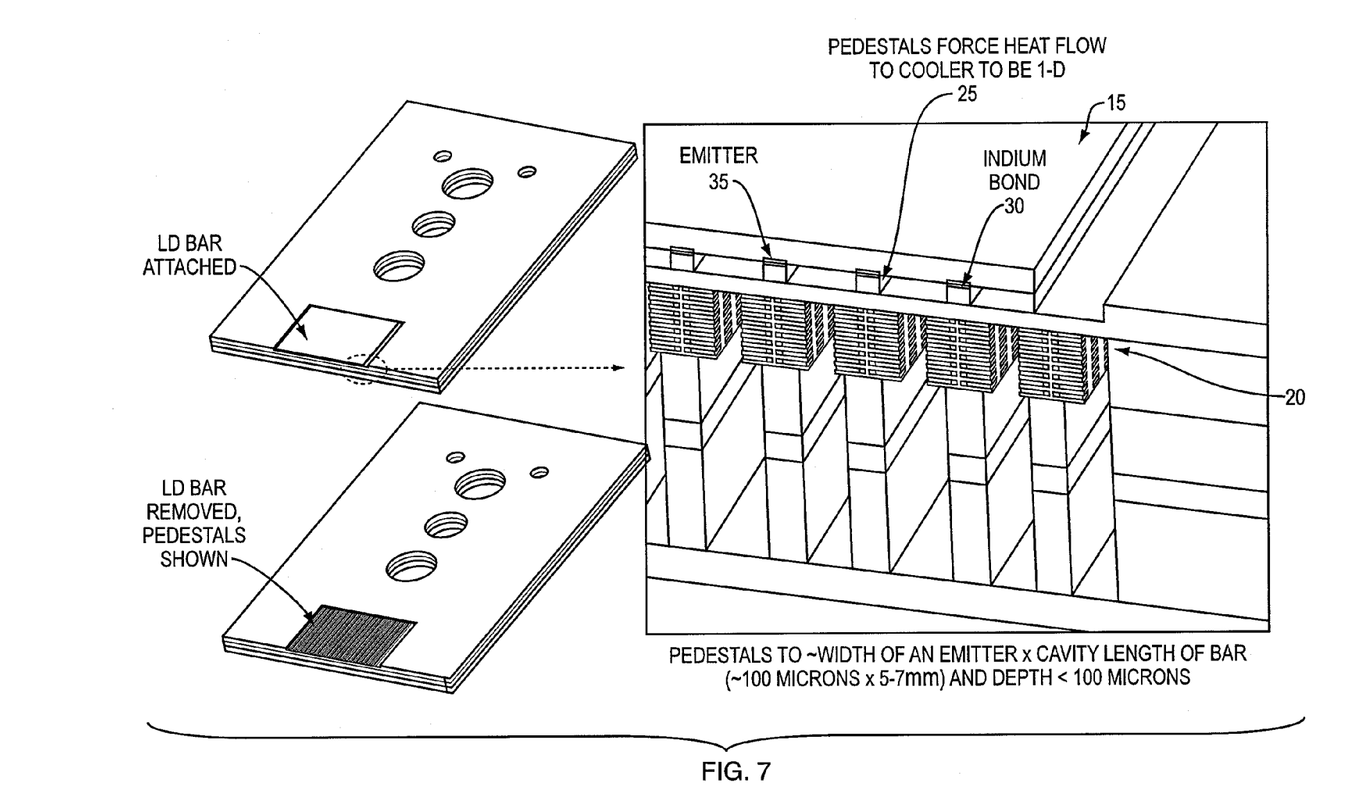
FIG. 7 is a graphical schematic representation of one embodiment of the system of these teachings.

Substantially 1D heat flow can be achieved by placing pedestals directly under each emitter in a laser diode (LD) bar as shown in FIG. 7. These pedestals only allow heat to flow directly under the emitter to the heat sink, which imposes the substantially 1D heat flow.

In one instance, one or more pedestals are disposed on the surface of the thermal management component (cooler or heat sink), the pedestals being in thermal contact with the thermal management component. The laser diode bar are placed on the pedestals such that each emitter is in thermal contact with one pedestal and disposed over the pedestal. In one instance, the laser diode bar is bonded to the pedestals. The material of the pedestals is selected such that there is an effective thermal connection between the laser diode bar and the thermal management component.

In one embodiment, shown in FIG. 7, pedestals 25 are disposed on the interface between the laser diode bar 15 and the thermal management component 20. The pedestals 25 are disposed substantially under the locations of the emitters 35 in the laser diode bar 15. In one instance, the pedestals have a width substantially equal to the width of an emitter and a length substantially equal to the cavity length of the bar. In one exemplary embodiment, not a limitation of these teachings, the height of each pedestal is less than 100 microns. In the embodiment shown in FIG. 7, the laser diode bars 15 are indium bonded to the pedestals 25. The indium bond constitutes an embodiment of a bond layer disposed on the pedestals.

In order to substantially minimize emitter temperature, the height of the pedestal should be substantially minimized and the thermal conductivity of the pedestals should be substantially maximized. In one instance, the connection between these parameters and emitter temperature is given by a simple algebraic expression relating temperature rise over the height of the pedestal to the local heat flux and pedestal thermal resistance: $\Delta T = \rho_{ped} \cdot q_{ped}$, where $\Delta T$ is the temperature rise over the height of the pedestal, $q_{ped}$ is the 1D heat flux in the pedestal and $\rho_{ped}$ is the thermal resistance of the pedestal. In turn, pedestal thermal resistance is defined by $\rho_{ped} = h_{ped}/\kappa_{ped}$, where $h_{ped}$ is the height of the pedestal and $\kappa_{ped}$ is the thermal conductivity of the pedestal. The substantially minimum height of the pedestals can be determined using finite element thermal analyses. The criteria for pedestal height will be the shortest height that gives an acceptably uniform emitter temperature. The fabrication method selected and corresponding tolerances (milling, plunge EDM, wet-etch lithography) will be manufacturing constraints that influence minimum pedestal height. In one instance, pedestals in the range 25-100 µm are within the scope of these teachings.

The height of each support member of the pedestal (referred to as "the height of the pedestal") and the material of the pedestal (determining the thermal conductivity of the pedestal) can be selected in order to obtain a desired temperature difference between the thermal management component and the base of the pedestal.

Figure 8A:
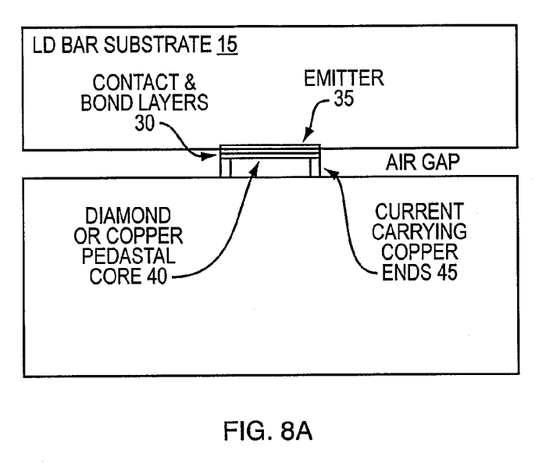
FIG. 8a is a graphical schematic representation of one embodiment of one component of the system of these teachings.

The thermal conductivity of the pedestals should be as high as practically feasible. In one embodiment, the base of the pedestal structure includes a material of higher thermal conductivity than a thermal conductivity of material the support members. In one instance, the material of higher thermal conductivity is encased in a high conductivity metal or a layer of high conductivity metal is disposed on the surface of the material of higher thermal conductivity. In one specific instance, the core of the pedestals can be composed of synthetic diamond. Since diamond is a dielectric material (non-conducting), it must be encased in a high conductivity metal to provide an electric current path from the p-side of the LD bar to the cooler. FIG. 8a illustrates the metal encased diamond (MED) pedestal concept. Finite element thermal analyses were performed to demonstrate that MED pedestals provide a uniform emitter temperature and acceptable emitter temperature rise penalty. Referring to FIG. 8a, in the embodiment shown therein, the emitter 35 in the laser diode bar 15 is placed over and in thermal contact with the base 40 of the pedestal, where the base 40 can include a material of higher thermal conductivity than the material of the support members ("ends") 45. In one instance, the base 40 includes synthetic diamond and the current carrying ends 45 are copper ends. In the embodiment shown in FIG. 8a, a bond layer 30 is disposed between the base 40 of the pedestal and the emitter 35. In one instance, a thin layer of high conductivity metal is disposed on the base 40 of the pedestal.

Figure 8B:
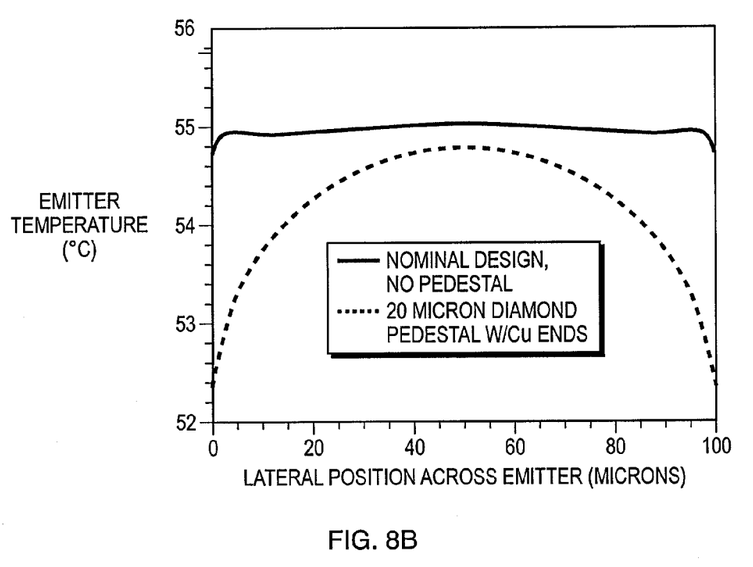
FIG. 8b is shows the results of FEA calculations illustrating the effects of use of pedestals.

FIG. 8b compares the temperature profiles across an emitter with and without a MED pedestal. As can be seen, the MED pedestal provides a very uniform emitter temperature with only a 0.4K temperature penalty. These comparisons demonstrate that pedestals have the potential for greatly reducing SA divergence while, at the same time, providing low emitter temperatures required for optimum LD bar performance. Further, finite element current conduction analyses have been performed showing MED pedestals do not disturb the current distribution in the emitter region when, for example, the top surface of the diamond core is covered with a 4 µm layer of gold and the sides are straddled with 10 µm layers of copper.

Figure 9:
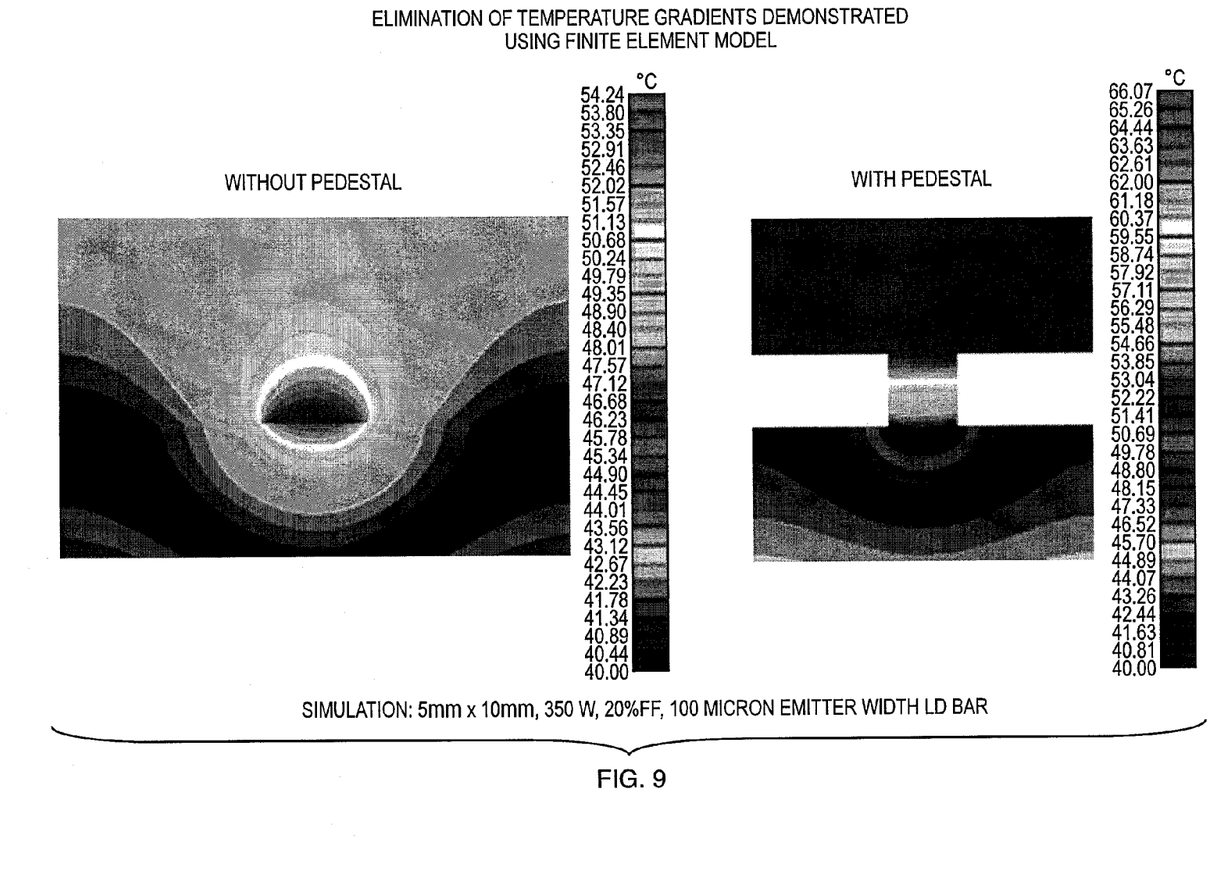
FIG. 9 a graphical representation of local emitter temperature versus lateral position across emitter for an embodiment with pedestals.
Figure 10A:
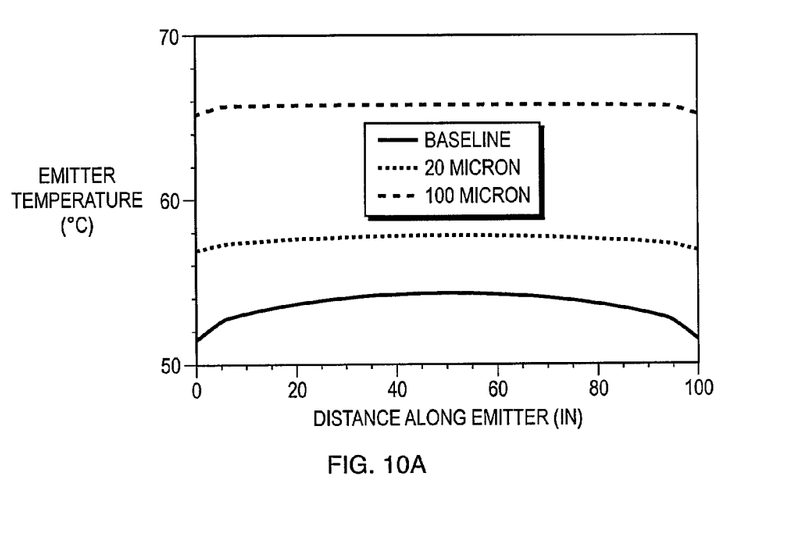
FIG. 10a shows other results of FEA calculations illustrating the effects of use of pedestals.

In the instance where the pedestals are made from metal only, such as, but not limited to, copper, the temperature rise over the height can be significant. FIG. 9 presents predicted temperature contours with and without a copper only pedestal. FIG. 9 shows that: 1) pedestals are effective for producing a uniform emitter temperature and 2) metal pedestals also present a 50% increase in the thermal resistance and a corresponding significant temperature rise. FIG. 10a compares emitter temperature profiles for various heights of copper pedestals. FIG. 10a also shows the ability of pedestals to provide a uniform emitter temperature, that uniformity improves with pedestal height and that emitter temperature penalty increases with pedestal height. For reference purposes, exemplary embodiment computations presented in FIGS. 8 through 10a are for a 20% fill factor (0.5 mm pitch), 100 µm emitters, 7 mm cavity length, 10 mm wide, LD bar operating at 350 A (330 W optical, 50% power conversion efficiency). The heat sink has been modeled as a 125 µm copper casing cooled by 25° C. water through a 30 mK-cm²/W resistance (typical of the thermal resistance of EPIC heat sinks).

It should be noted that other embodiments are also within the scope of these teachings. Other exemplary embodiments include fabricating trenches on the surface of the laser diode bar and combinations of fabricating the trenches on the surface of the laser diode bar and the use of pedestals.

Pedestals can be fabricated, for example but not limited to, by milling. Other conventional fabrication techniques are also within the scope of these teachings.

Figure 10B:
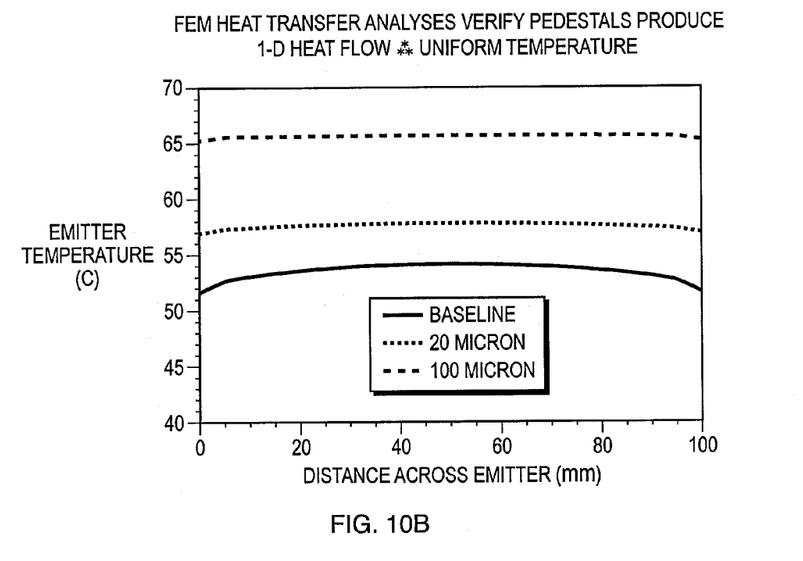
FIG. 10b shows more results of FEA calculations illustrating the effects of use of pedestals.

FEA heat transfer calculations, shown in FIG. 9 and FIG. 10b, indicate that the use of pedestals under the emitters results in uniform temperature across the emitter.

Figure 11A:
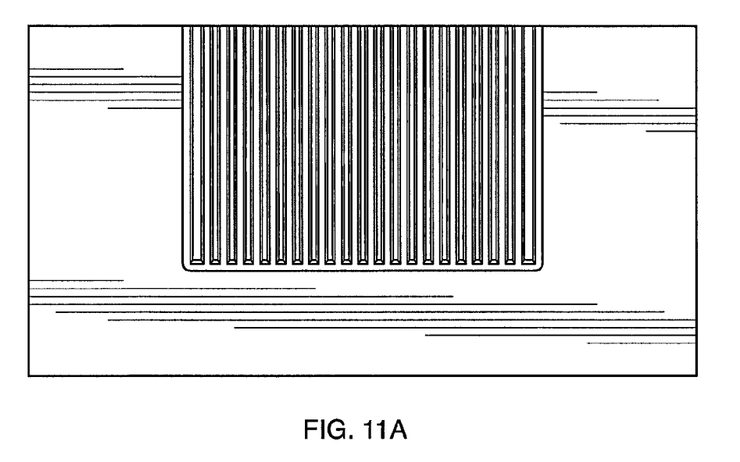
FIGS. 11a, 11b are pictorial representations of an exemplary embodiment of the system of these teachings.
Figure 11B:
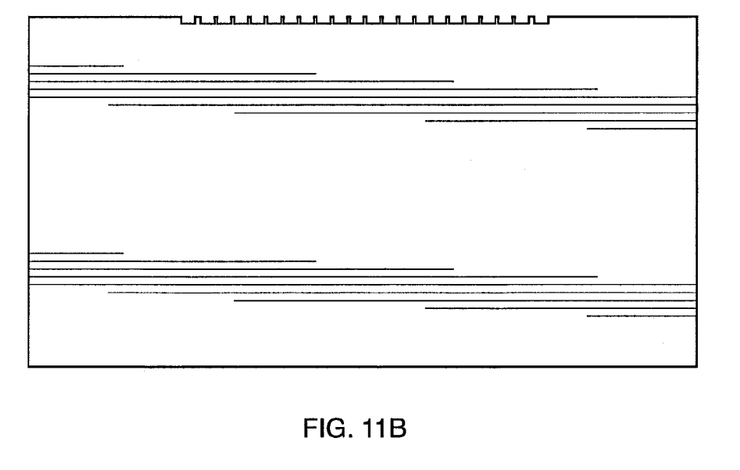
Figure 12:
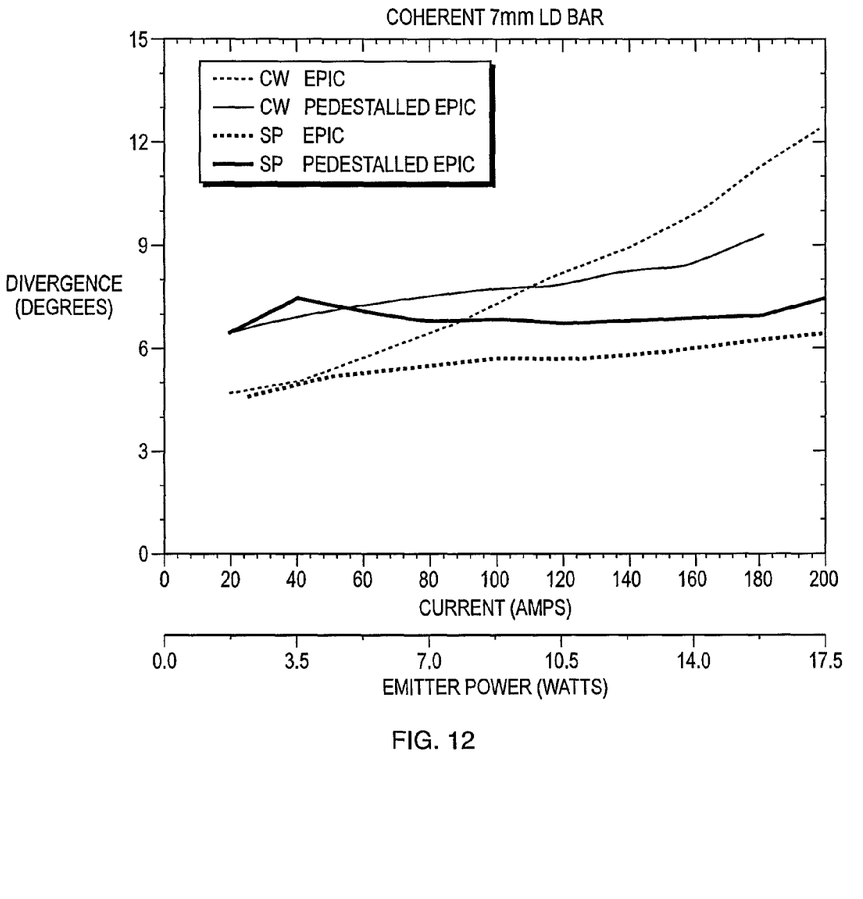
FIG. 12 shows graphical representations of results of the exemplary embodiment of the system of these teachings.

An exemplary embodiment is presented hereinbelow in order to elucidate these teachings. It should be noted that these teachings are not limited to only the exemplary embodiment A LD-bar cooler ("EPIC") assembly containing pedestals was constructed to demonstrate 1D heat flow reduces slow axis divergence. FIGS. 11a, 11b show the pedestal pattern machined in the surface of the thick EPIC cooler for this purpose. Using a conventional die bonding process, a 7 mm cavity length, 100 µm wide, 20% fill factor, 100 micron emitter width, 19 emitter Coherent LD bar was bonded to the pedestal pattern shown in FIGS. 11a, 11b. FIG. 12 compares the slow axis divergence under continuous (CW) and short pulse (SP) operation, with and without pedestals. This figure demonstrates that minimizing intra-cavity thermal lensing/distortions using pedestals to eliminate emitter temperature gradients decreases slow axis divergence, which improves LD brightness.

Some of the benefits of the use of pedestals include:
Pedestals result in uniform junction temperature by making heat flow locally 1-D;
Improved bonding of LD bar to cooler
  Contact area greatly reduced, which greatly reduces bonding load, which
  Greatly reduces bowing of cooler surface, which minimizes smile
During bonding, the pedestals will behave independently of one another, which will reduce high stress regions that occur on perimeter of a LD bars bonded to flat, pedestal-free surfaces
Flexure of pedestals: pedestals will flex independently of one another in response to temperature changes, which may minimize stress induce changes in LD performance;
Local cooling could be implemented, reducing coolant flow by as much as 5× for 20% FF bars;
When coolant flow is reduced by ~5×, using two-phase heat exchange becomes a reality: the exhaust flow, made up of a mix of gas and liquid, could be handled within the available flow passage cross-sectional areas without generating unacceptable backpressures or reaching sonic conditions;
Volume changes, thus stress risers, due to formation of $AuIn_2$ intermetallic during die bonding will be minimized by reducing the area over which these intermetallics form by breaking up these regions with flexible pedestals separated by void areas (inter-pedestal regions).

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although the invention has been described with respect to various embodiments, it should be realized these teachings are also capable of a wide variety of further and other embodiments within the spirit and scope of the appended claims.

What is claimed is:

1. A system for reducing slow axis divergence in a laser diode component, the system comprising:
a thermal management component; and
one or more pedestal structures; each pedestal structure comprising a base and two support members, each support member being disposed along a length of the base and extending away from the base, one support member being disposed at one end of the base and another support member being disposed at another end of the base, a distance from said one support member to said another support member being substantially equal to a width of the base; the two support members being disposed on and in thermal and electrical connection to the thermal management component; the base being disposed away from the thermal management component; the width of the base of each one pedestal structure being substantially equal to a width of each one emitter in the laser diode component; wherein the laser diode component has one or more emitters;
said each one pedestal structure is configured to be disposed substantially under said each one emitter; materials of the one or more pedestal structures being selected such that an effective thermal connection is established between the one or more emitters and thermal management component; a height of said each support member in one pedestal structure being a distance from the thermal management component to the base in said one pedestal structure.

2. The system of claim 1 wherein the height of said each support member is at most about 100 µm.

3. The system of claim 1 wherein the height of said each support member in one pedestal structure between about 25 µm to about 100 µm.

4. The system of claim 1 wherein the height of said each support member and a material of said one pedestal structure are selected in order to obtain a desired temperature difference between the thermal management component and the base of said one pedestal structure.

5. The system of claim 1 wherein, in order to restrict a temperature difference between the thermal management component and the base of said one pedestal structure to a minimum, the height of said each support member is selected to be a smallest height and a thermal conductivity of the material of said one pedestal structure is selected as to be a largest thermal conductivity.

6. The system of claim 5 wherein said temperature difference ($\Delta T$) is given by $$\Delta T(h_{ped}/\kappa_{ped})q_{ped};\text{ wherein}$$

$q_{ped}$ is the 1D heat flux in said one pedestal structure,
$h_{ped}$ is the height of said each support member in said one pedestal structure, and
$\kappa_{ped}$ is the thermal conductivity of said one pedestal structure.

7. The system of claim 1 wherein the base in said each pedestal structure comprises a material of higher thermal conductivity than a thermal conductivity of material of said each support member.

8. The system of claim 7 wherein said material of higher thermal conductivity is encased in a high conductivity metal.

9. The system of claim 7 wherein a layer of high conductivity metal is disposed on a surface of said material of higher thermal conductivity, said surface of said material being a surface nearest to said one emitter.

10. The system of claim 7 wherein said material of higher thermal conductivity is synthetic diamond.

11. The system of claim 10 wherein the synthetic diamond is encased in a high conductivity metal.

12. The system of claim 11 wherein a layer of high conductivity metal is disposed on a surface of the synthetic diamond.

13. The system of claim 12 wherein the high conductivity metal is gold.

14. The system of claim 1 wherein a bond layer is disposed on said each pedestal structure.

15. The system of claim 14 wherein said bond layer comprises indium.

16. The system of claim 1 wherein said each pedestal structure comprises a metal.

17. The system of claim 16 wherein said each pedestal structure comprises copper.

18. A method for reducing slow axis divergence in a laser diode component, the method comprising:
   placing one or more pedestal structures ("pedestals") on a thermal management component; each pedestal structure comprising a base and two support members, each support member being disposed along a length of the base and extending away from the base, one support member being disposed at one end of the base and another support member being disposed at another end of the base, a distance from said one support member to said another support member being substantially equal to a width of the base; the two support members being disposed on and in thermal and electrical connection to the thermal management component; the base being disposed away from the thermal management component; the width of the base of each one pedestal structure being substantially equal to a width of each one emitter in the laser diode component; and
   placing the laser diode component such that emitters are disposed over the one or more pedestal structures.

19. The method of claim 18 further comprising placing a bond layer on said each pedestal structure; and wherein each emitters is disposed over the bond layer.

20. The method of claim 18 wherein the base in said each pedestal structure comprises a material of higher thermal conductivity than a thermal conductivity of material of said each support member.

21. The method of claim 20 further comprising placing a layer of high conductivity metal on a surface of said material of higher thermal conductivity, said surface of said material being a surface nearest to said one emitter.

* * * * *